(12) United States Patent
Hamada et al.

(10) Patent No.: US 11,011,346 B2
(45) Date of Patent: May 18, 2021

(54) ELECTRON BEAM DEVICE AND IMAGE PROCESSING METHOD

(71) Applicant: HITACHI HIGH-TECH CORPORATION, Tokyo (JP)

(72) Inventors: Koichi Hamada, Tokyo (JP); Kei Sakai, Tokyo (JP); Satoru Yamaguchi, Tokyo (JP)

(73) Assignee: HITACHI HIGH-TECH CORPORATION, Tokyo (JP)

(*) Notice: Subject to any disclaimer, the term of this patent is extended or adjusted under 35 U.S.C. 154(b) by 0 days.

(21) Appl. No.: 16/810,246

(22) Filed: Mar. 5, 2020

(65) Prior Publication Data

US 2020/0303159 A1 Sep. 24, 2020

(30) Foreign Application Priority Data

Mar. 22, 2019 (JP) .............................. JP2019-054942

(51) Int. Cl.
| | | |
|---|---|---|
| *H04N 5/349* | (2011.01) | |
| *H01J 37/22* | (2006.01) | |
| *H01J 37/28* | (2006.01) | |
| *H04N 7/18* | (2006.01) | |

(52) U.S. Cl.
CPC ............ *H01J 37/222* (2013.01); *H01J 37/28* (2013.01); *H04N 5/349* (2013.01); *H04N 7/18* (2013.01); *H01J 2237/221* (2013.01)

(58) Field of Classification Search
CPC ........ H01J 37/222; H01J 37/28; H04N 5/349; H04N 7/18
See application file for complete search history.

(56) References Cited

U.S. PATENT DOCUMENTS

| | | | | |
|---|---|---|---|---|
| 7,834,317 | B2 * | 11/2010 | Nakagaki | ............... H01J 37/265 250/310 |
| 2005/0114332 | A1 * | 5/2005 | Lee | ..................... G06F 16/5838 |
| 2006/0108525 | A1 * | 5/2006 | Nakagaki | ................ H01J 37/28 250/310 |
| 2006/0243905 | A1 | 11/2006 | Yamaguchi et al. | |
| 2007/0019887 | A1 * | 1/2007 | Nestares | ............... G06T 3/4053 382/299 |
| 2011/0249110 | A1 | 10/2011 | Okai et al. | |
| 2013/0038749 | A1 * | 2/2013 | Hatakeyama | .......... H04N 5/217 348/222.1 |
| 2013/0146763 | A1 | 6/2013 | Kawada et al. | |
| 2013/0271595 | A1 | 10/2013 | Hiroi et al. | |

(Continued)

FOREIGN PATENT DOCUMENTS

| | | |
|---|---|---|
| CN | 102930507 A | 2/2013 |
| CN | 108921794 A | 11/2018 |

(Continued)

OTHER PUBLICATIONS

Taiwanese Office Action dated Dec. 3, 2020 for Taiwanese Patent Application No. 109102980.

*Primary Examiner* — Jamie J Atala
*Assistant Examiner* — Hesham K Abouzahra
(74) *Attorney, Agent, or Firm* — Volpe Koenig (57) ABSTRACT

To acquire a correction image by performing a sub-pixel shift process for shifting an image using a pixel interpolation filter by a pixel shift amount between pixels and a frequency correction process for correcting a frequency characteristic of the image after shifted.

13 Claims, 10 Drawing Sheets

(56) References Cited

U.S. PATENT DOCUMENTS

| | | | |
|---|---|---|---|
| 2013/0322737 | A1 | 12/2013 | Murakami et al. |
| 2017/0296034 | A1* | 10/2017 | Sasaki ................ A61B 1/00009 |
| 2019/0361358 | A1 | 11/2019 | Tel et al. |

FOREIGN PATENT DOCUMENTS

| | | |
|---|---|---|
| JP | 2006-308471 A | 11/2006 |
| TW | 201835676 A | 10/2018 |
| WO | 2010/070815 A | 6/2010 |
| WO | 2011/148975 A1 | 12/2011 |
| WO | 2012/098605 A1 | 7/2012 |

* cited by examiner

WITHOUT SHIFT

FIG. 5B

HORIZONTAL/VERTICAL SHIFT BY 0.5 PIXEL

SET DRIFT CORRECTION CONDITIONS

CORRECT DRIFT

◉ ON   ○ OFF

SELECT DRIFT CORRECTION METHOD
○ CORRECT FRAME
○ CORRECT FIELD
◉ CORRECT FRAME/FIELD

NUMBER OF FIELDS [ 2 ]

SELECT IMAGE SHIFTING METHOD
○ PIXEL UNIT
○ SUB-PIXEL
◉ SUB-PIXEL WITH FREQUENCY CHARACTERISTIC CORRECTION

[ OK ]   [ DEFAULT ]   [ CANCEL ]

ELECTRON BEAM DEVICE AND IMAGE PROCESSING METHOD

BACKGROUND

The present invention relates to an electron beam device and an image processing method.

In recent years, the size of a pattern to be formed on semiconductor substrates or insulating substrates has increasingly been made finer, and a high magnification is required even for observation or dimension measurement using a scanning electron microscope.

The scanning electron microscope is an apparatus which emits an electron beam which has been finely throttled onto a specimen, detects two-dimensional electrons occurred by electron beam irradiation and reflected electrons, and performs modulation for brightness based on an amount of detected electrons so as to form an image.

If the specimen is observed at a high magnification, the so-called image drifting, may occur. In this phenomenon, a target image to be observed and having a fine pattern is moved over time. This causes a problem, such as image blur or a decrease in accuracy of length measurement.

For example, when it is intended to obtain a frame image of 512*512 pixels at an observation magnification of 100,000 times, the size of one pixel is approximately 2.6 nm on the specimen. Currently, the demanded accuracy of the size calculation is 0.5 nm or lower. In the pattern having significant image drift, the image drift of approximately 1 to 2 nm is observed in a time (40 milliseconds) for obtaining one frame image. If the size is calculated in such a drift pattern, the size deviation occurs approximately by 2 nm. Charging of the specimen by the electron irradiation is the major occurrence factor of the image drift.

Japanese Unexamined Patent Application Publication No. 2006-308471 discloses a method for acquiring an image (frame images) of a specimen surface while displacing a stage on which a specimen is mounted. For this acquisition, the method includes the steps of: when acquiring integrated images, grouping plural pieces of acquired images (frame images) to create integrated images correspondingly respectively to the groups; calculating image displacement quantity between the integrated images and calculating a relational expression between the image displacement quantity and the number of images; calculating the displacement quantity of the plural pieces of images based on the relational expression; and correcting and integrating the images by the displacement quantity.

Using this technique, even if the images are moved in the observation field due to displacement of the stage, it becomes possible to acquire the integrated images without degradations, such as out-of-focus of the images. Even without displacement of the stage, when the images are observed as they are moved due to the charged specimen, it is deduced to acquire the integrated images with only a small blur.

WO2010/070815 proposes a method for enhancing the accuracy of the length measurement, by converting a movement amount between frame images into movement between field images. This method is effective for improving the accuracy of the length measurement at a high magnification (particularly, it is significant in the observation field of approximately 1 micron or less) in which the accuracy of length measurement is not satisfactory with using the method of Japanese Unexamined Patent Application Publication No. 2006-308471.

SUMMARY

Japanese Unexamined Patent Application Publication No. 2006-308471 and WO2010/070815 disclose that the movement amount of images is calculated to shift the image, but do not disclose a method for shifting the image. In both of the methods, the image acquired through image processing is shifted. If an amount of shifting the image (hereinafter referred to as a shift amount) is an integer amount of pixels, the image may simply be shifted to other pixel positions as is by the pixel value of the image. In this case, there is no need to concern a change in the length measurement value as a result of shifting the image.

However, if the shift value has an amount of sub-pixels (position between pixels), the value of each pixel of the shifted image needs to be interpolated (interpolation using a pixel interpolation filter) based on the value of pixels in the positions of the existing peripheral pixels. If the pixel interpolation filter for interpolating the value of pixels causes a change in the frequency characteristic of the image after shifted from the frequency characteristic of the image before shifting, a recognized problem is that the length measurement value will be changed.

If the length measurement value is changed due to a process for shifting the image, an appropriate length measurement value cannot only be obtained, but also it causes a deterioration in reproducibility of length measurement. In particular, the length measurement value may differ every time the length measurement is performed, even if the same specimen is measured.

An object of the present invention is to prevent a change in the length measurement value due to shifting of the image, even when the shift amount has an amount of sub-pixels.

According to one aspect of the present invention, there is provided an electron beam device comprising an electron microscope unit and a control unit, wherein the electron microscope unit scans a specimen and irradiates an electron beam thereon, and detects a signal emitted from the specimen, and wherein the control unit includes a data processing unit which converts a signal detected by the electron microscope unit into an image, and a correction calculation processing unit which performs a sub-pixel shift process for shifting the image by a pixel shift amount between pixels using a pixel interpolation filter and a frequency correction process for correcting a frequency characteristic of the image after shifted, thereby acquiring a correction image.

According to an aspect of the present invention, there is provided an image processing method, using an electron beam device having an electron microscope unit and a control unit, the method comprising the steps of: scanning a specimen by irradiating an electron beam thereon, and detecting a signal emitted from the specimen, in the electron microscope unit; converting the signal detected by the electron microscope unit into an image, in the control unit; and performing a sub-pixel shift process for shifting the image by a pixel shift amount between pixels using the electron microscope unit and a frequency correction process for correcting a frequency characteristic of the image after shifted, thereby acquiring a correction image, in the control unit.

According to an aspect of the present invention, there is provided an electron beam device, in which a change in a length measurement value due to shifting of the image can be prevented, even when a shift amount has an amount of sub-pixels.

DETAILED DESCRIPTION

Preferred embodiments will now specifically be described by reference to the accompanying drawings.

First Embodiment

The entire configuration of an electron beam device of the first embodiment will now be described by reference to FIG. 1.

The electron beam device is a scanning electron microscope including a drift correction function. Even if an image drift occurs, as a phenomenon in which an image is moved over time at the time of observing a specimen, the electron beam device calculates and corrects the amount of drift, thereby enabling to acquire a clear frame image.

Figure 2A:
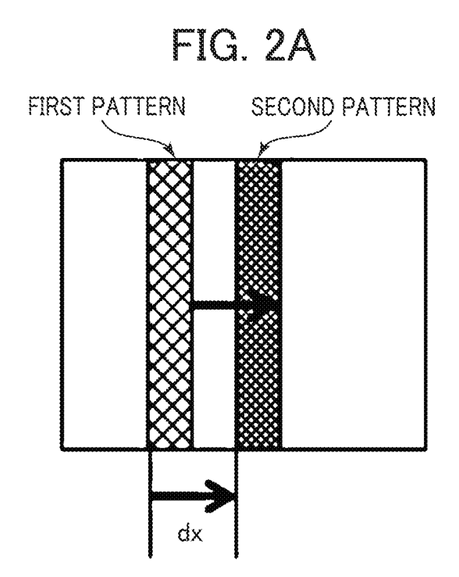
FIG. 2A is a conceptual diagram of an amount of drift, illustrating line patterns.
Figure 2B:
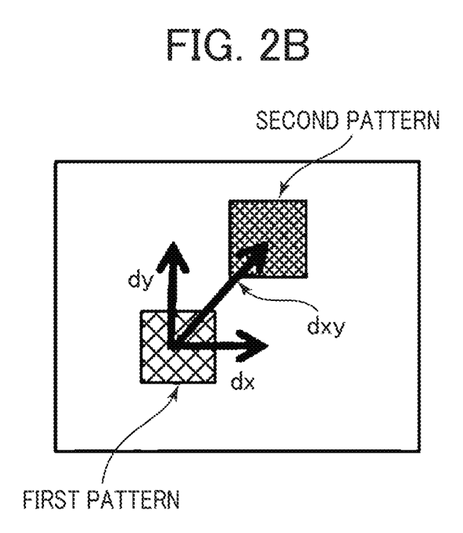
FIG. 2B is a conceptual diagram thereof, illustrating dot patterns.

Note that the "amount of drift" represents an amount of position deviation (amount of movement) of the patterns between the frame images illustrated in FIG. 2A and FIG. 2B and an amount of movement between field images.

Figure 1:
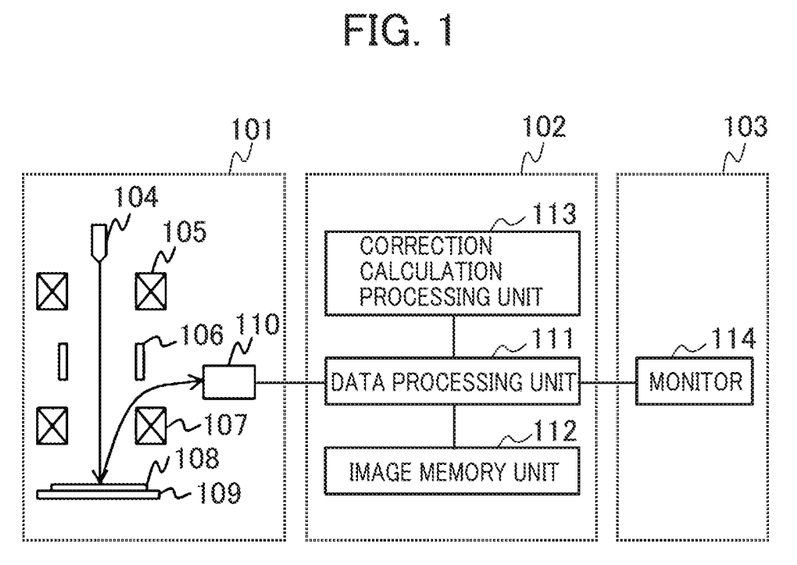
FIG. 1 is a diagram illustrating an entire configuration of an electron beam device of a first embodiment.

As illustrated in FIG. 1, the electron beam device as a scanning electron microscope has an electron microscope unit 101, a control unit 102, and a display unit 103. After an electron beam emitted from an electron source 104 is converged by a converging lens 105 and an objective lens 107, and is irradiated to a specimen placed on a specimen stage 109. A specimen 108 is two-dimensionally scanned by the electron beam with a deflector 106. The secondary electrons and reflected electrons generated from the specimen 108 are detected by a detector 110. A data processing unit 111 performs modulation for a signal of brightness corresponding to a frame image. Then, the image is stored in an image memory unit 112.

The frame image stored in the image memory unit 112 is drift-corrected in a correction calculation processing unit 113. Then, a corrected image is displayed on a monitor 114. Functions of the data processing unit 111 and the correction calculation processing unit 113 can be carried out by the CPU. The image memory unit 112 can be provided in a memory unit connected to the CPU. Each of these units may be configured with dedicated hardware.

In the measurement using the scanning electron microscope, the frame image which has generally been obtained by scanning an observation field for a plural number of times is used. In this case, the "measurement" represents, for example, calculation of the size of the pattern formed on a semiconductor wafer. The frame image which is obtained by scanning the specimen 108 for the plural number of times is a frame image with a high S/N ratio, and thus have high accuracy in size, as compared with a frame image which is obtained by scanning the specimen only once. However, when charging of the specimen 108 has advanced during the scanning, the scanning position is deviated due to the charging, resulting in a blurred frame image. Even if the calculation is performed using the blurred frame image, high accuracy of size cannot be guaranteed. Thus, the frame images in association with each scanning are corrected and overlapped with each other, using the image processing, to acquire a clear frame image at the time of scanning for the plural number of times.

By reference to FIG. 2A and FIG. 2B, an amount of drift between frame images will now be described. In FIG. 2A and FIG. 2B, the observation patterns are classified as one-dimensional patterns and two-dimensional patterns, respectively, and the amounts of drift are defined.

In this case, the one-dimensional patterns are almost unique patterns in a certain direction of the frame image, and are exemplified, for example, in FIG. 2A. The two-dimensional patterns include all patterns except the one-dimensional pattern, and are exemplified, for example, in FIG. 2B. In FIGS. 2A and 2B, the first frame image and the second frame image are overlapped with each other, to visibly represent the positional relationship between their patterns.

In the line patterns of FIG. 2A, even if the drift advances in the longitudinal direction of the lines, the amount of drift cannot be obtained. Thus, the amount of drift in a direction vertical to the longitudinal direction is calculated. In this case, the second pattern is moved to the right side, as compared with the first pattern, and its movement amount "dx" is the amount of drift.

In the dot patterns of FIG. 2B, the drift of the patterns is in the two-dimensional direction. In this case, the second pattern is moved to the right side as compared with the first pattern, and its movement amount "dxy" is the amount of drift. The amount of drift "dxy" can be decomposed into an amount of drift "dx" in the horizontal direction of the frame image and an amount of drift "dy" in the vertical direction thereof. Drift correction is performed by shifting the second frame image by the amount of drift so as to be overlapped with the first frame image. This process of shifting the image merely by the amount of drift is called drift correction.

Descriptions will now be made to the kinds of images obtained by a scanning electron microscope in combination with the formation process of the images.

The kinds of images include and are classified as the frame image and the field image. The frame image corresponds to an image obtained by scanning once the observation field. The field image is defined as an image obtained by scanning once a part of the field, that is, an element image forming the frame image. The frame image is created by adding the entire field images. Drift correction is carried out for the frame image and the field image (see Japanese Unexamined Patent Application Publication No. 2006-308471 and WO2010/070815).

To carry out the drift correction, it is necessary to perform a process for shifting the image. In the first embodiment, the relationship between the process for shifting the image and the length measurement value is focused. If the amount of shifting (shift amount) the image is an amount of integer pixels, the pixel positions may merely be shifted by the pixel value of the image as they are. Thus, the shifting of the image does not change the length measurement value. However, when the shift amount is equal to the amount of sub-pixel (position between pixels), the pixel value of each pixel of the shifted image needs to be created by interpolation (interpolation by a pixel interpolation filter) based on the pixel value of the image before shifting. Because shifting of the image is equivalent to conversion of the coordinate system, descriptions will now be made to conversion of the coordinate system.

Descriptions will now be made to an example in which conversion is performed from the coordinate systems (u, v) before shifting the image to the coordinate systems (x', y') after shifting the image, using linear interpolation from surrounding four pixels.

Figure 3:
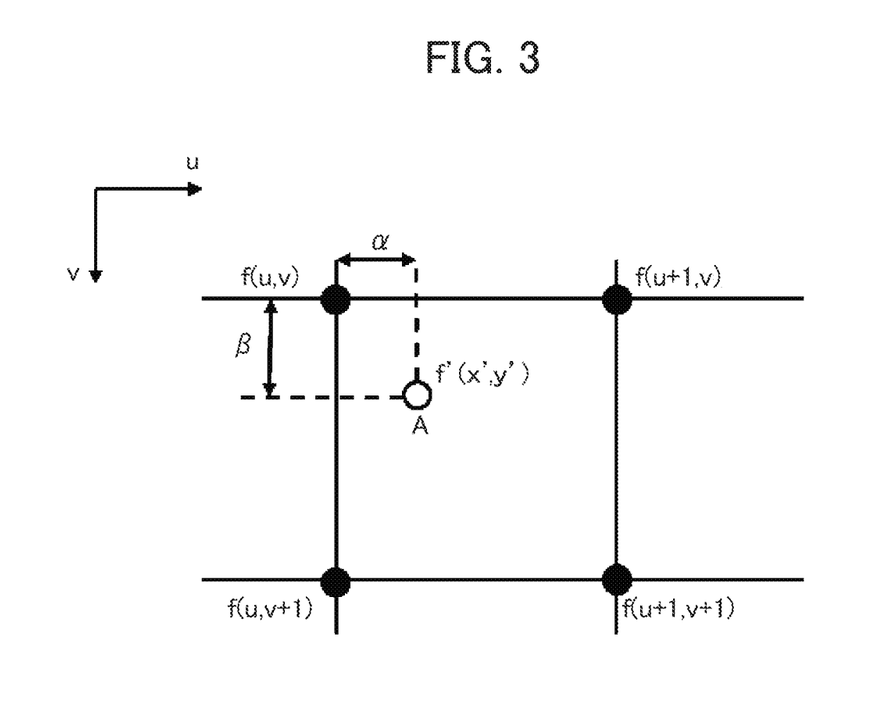
FIG. 3 is a diagram for illustrating a sub-pixel interpolation method.

A pixel value f' (x', y') of a new pixel is interpolated by the distance from the position of a corresponding original image. As illustrated in FIG. 3, when the pixel position of the original image corresponding to the new pixel position after coordinate conversion (after shifting the image) corresponds to a point A (x', y') between pixels, there does not exist such a position on the image before shifting the image. Thus, the pixel value of the position (x', y') is obtained by a weighted average of the distance from the surrounding four pixels. A conversion equation (Equation 1) is as follows: when the pixel value before coordinate conversion is "f"; when the brightness value after coordinate conversion is "f"; when integer parts "x" and "y" are "u" and "v"; and when the decimal parts are "α" and "β".

$$f'(x',y')=f(u,v)\cdot(1-\alpha)\cdot(1-\beta)+f(u+1,v)\alpha\cdot(1-\beta)+f(u,v+1)\cdot(1-\alpha)\cdot\beta+f(u+1,v+1)\cdot\alpha\cdot\beta$$ (Equation 1)

As will be described later, because this conversion has a function as a low-pass filter for the original image, a change is made both in the frequency characteristic of an image before shifting the image and the frequency characteristic of the image after shifting the image. If the frequency characteristic of the image is changed, a problem is that the length measurement value is changed as a result that the edge at the length measurement is dull.

Figure 4A:
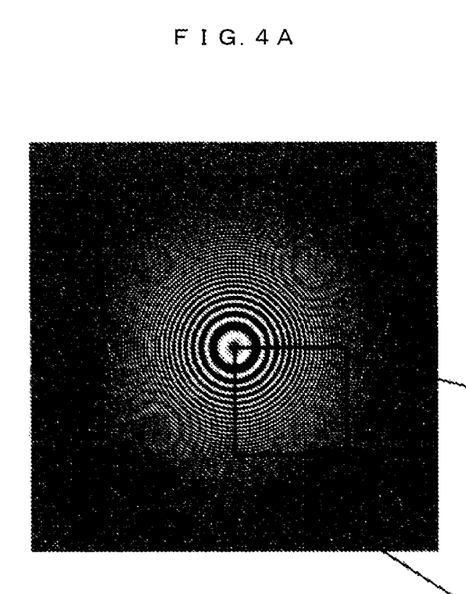
FIG. 4A and FIG. 4B are diagrams each illustrating an example of a CZP (Circulator Zone Plate) for viewing a frequency characteristic in an image.
Figure 4B:
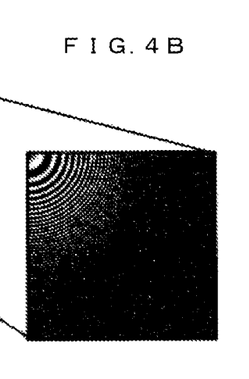

It is possible to see how the frequency characteristic of the image is changed by image interpolation, by processing the pattern in which the frequency characteristic appears in the form of a pixel value, using the pixel interpolation filter, as illustrated in FIG. 4A and FIG. 4B.

This pattern is called a CZP (Circular Zone Plate), and is an image which is generally used for visually confirming the frequency characteristic of the image as a result of image processing. Normally, the image is configured in a manner that the center of the image is the direct current component, and the image end is the maximum frequency (Nyquist frequency) of the image. It is understood from the experiment that the length measurement value is changed due to the frequency components from the direct current to approximately half (approximately ¼ of the sampling frequency) the Nyquist frequency. It is considered that, as the pixel interpolation filter, one without direction dependency (vertically and horizontally symmetrical filter coefficients) is generally used. The image pattern corresponding to a part of this CZP as illustrated in FIG. 4B is extracted from FIG. 4A.

As illustrated in FIG. 4B, using a part of the CZP, when the low-pass filter of the pixel interpolation filter does not have a sufficient blocking region, it is possible to prevent that a change in the frequency characteristic is hardly recognized in the form of an image, due to occurrence of a folding distortion in which the high frequency part is folded back toward the low frequency part.

Figure 5A:
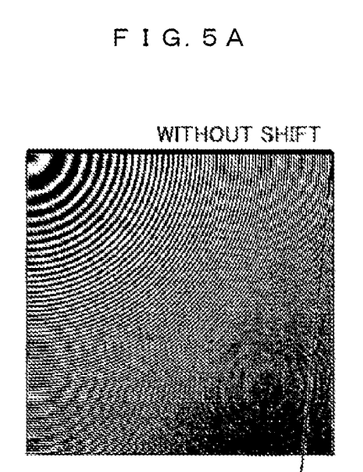
FIG. 5A, FIG. 5B, and FIG. 5C are diagrams each illustrating a change in a partial CZP by an interpolation filter.
Figure 5B:
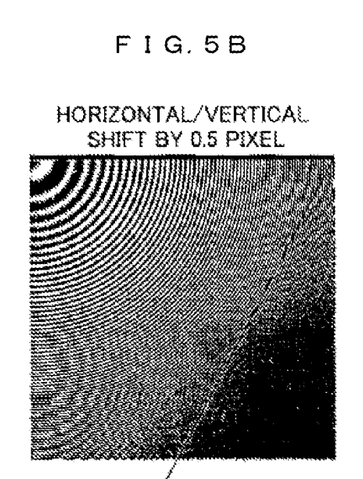

For example, FIG. 5B illustrates an image processing result of the CZP which is shifted in horizontal/vertical directions by 0.5 pixel, using the linear interpolation expressed by the above Equation 1.

Figure 5C:
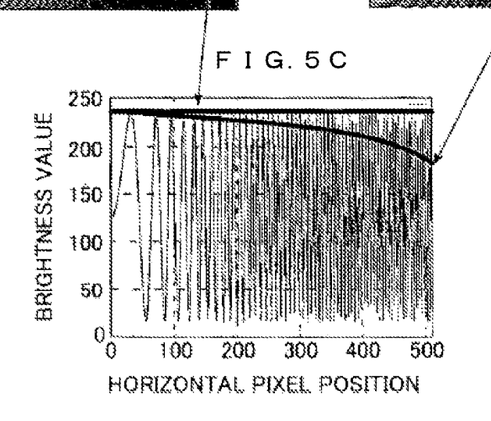

As compared with the image without pixel shift as illustrated in FIG. 5A, the image with shift in accordance with linear interpolation is illustrated in FIG. 5B. The change in the frequency may be recognized based on the change in its brightness value, while the change in the frequency in the horizontal direction of the image may be recognized based on the change in the brightness value of the upper end of the image of each of FIG. 5A and FIG. 5B. Changes of the brightness values are plotted with respect to the horizontal pixel positions, on the upper ends of the respective images, as illustrated in FIG. 5C.

By drawing a curved line smoothly connecting the maximum values in the horizontal positions, it is possible to see the change in the frequency. Regarding the left end of the image of FIG. 5B, the same brightness values as those of FIG. 4A are applied. However, it is seen that the brightness is decreased rightward (that is, as the frequency increases). This decrease in the brightness value corresponds to the change in the frequency characteristic due to the pixel interpolation filter.

Because variation amounts in the frequency components can be recognized, if the frequency characteristic of FIG. 5A is corrected in order to cancel the variation, it is possible to create the same frequency characteristic of FIG. 5B as that of FIG. 5A. The variation of the frequency characteristic depends on the configuration method and interpolation position of the pixel interpolation filter (linear interpolation in this example) and the interpolation position. Thus, even with any other image processed using the same pixel interpolation filter, it is possible to correct the frequency characteristic similarly to that before pixel interpolation, in a frequency range in which measurement is possible with this CZP.

Figure 6:
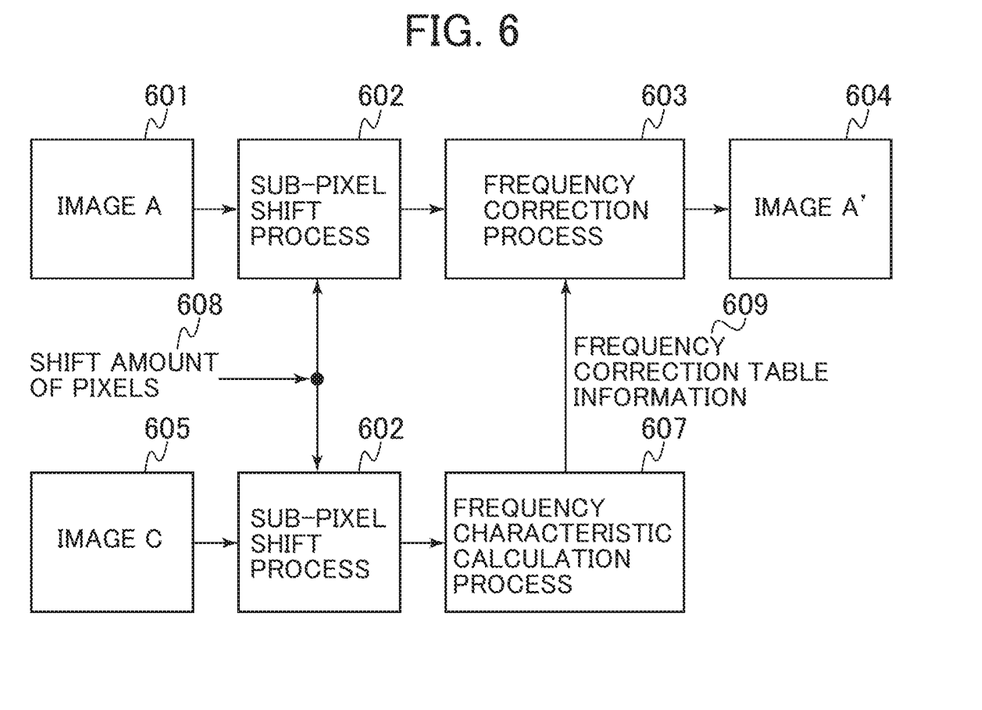
FIG. 6 is a diagram for explaining a drift correction process of the first embodiment.

By reference to FIG. 6, descriptions will now be made to a drift correction (image shift) process carried out by the correction calculation processing unit 113 of FIG. 1.

An image A (601) is an image before drift correction, while an image A' (604) is an image after drift correction. A sub-pixel shift process (602) is a process for shifting an image by pixel interpolation. A frequency correction process (603) is a process for correcting a frequency characteristic of the image after shifted. A pixel shift amount (608) is an amount of shifting an image (may be obtained, for example, by any of the methods disclosed in Japanese Unexamined Patent Application Publication No. 2006-308471 and WO2010/070815).

In the conventional drift correction process, the image A (601) is shifted by the sub-pixel shift process (602), and then output as the image A' (604), based on the pixel shift amount (608).

In the first embodiment, a particular image C (605) for calculating a frequency characteristic is shifted, by the same pixel shift amount (608) as that for shifting the image A (601) and in accordance with the same sub-pixel shift process (602) as that for the image A (601). The image C has a pattern (for example, CZP) of which a change in the frequency characteristic of the image can be recognized. The frequency characteristic is obtained (607) from a resultant image after the process for shifting the image C (605), and information for correcting the frequency (in this case, the frequency correction table 609) is output.

Figure 9:
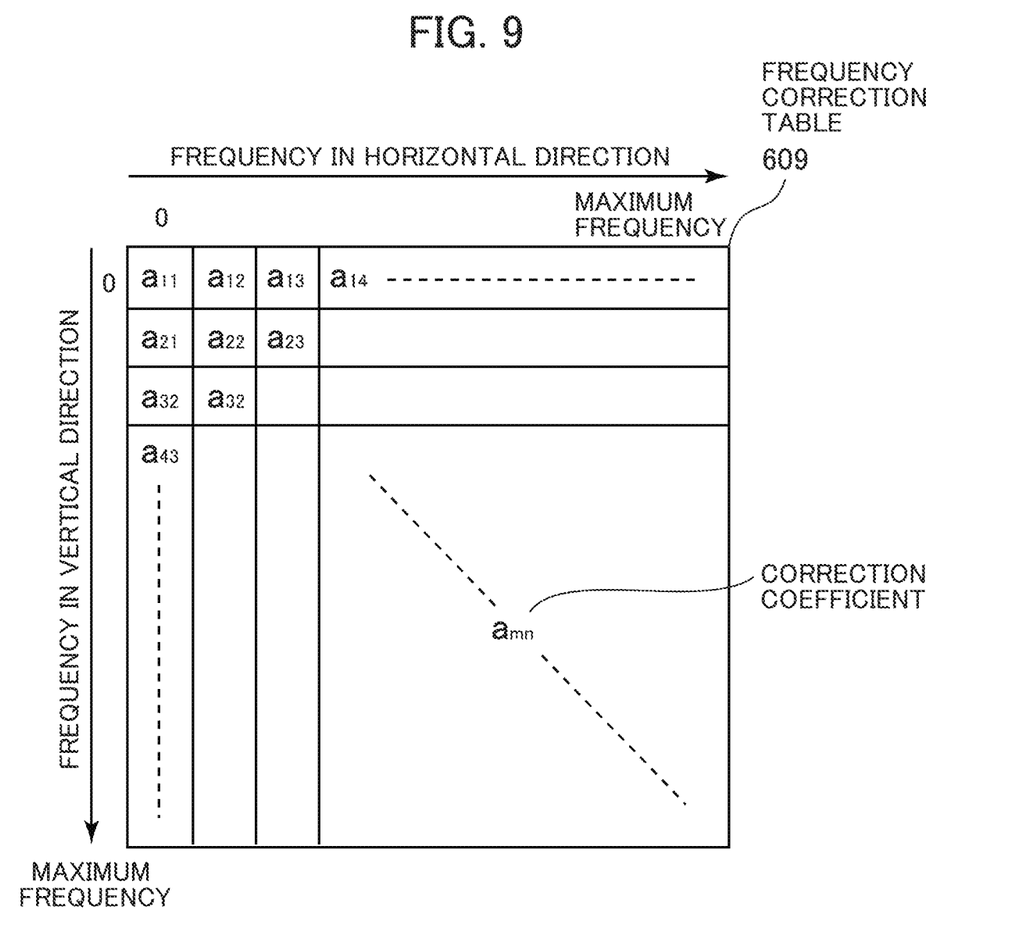
FIG. 9 is a diagram illustrating an example of a frequency correction table.

FIG. 9 illustrates an example of the frequency correction table (609).

The size of the frequency correction table (609) is arbitrary, and its maximum value is equal to the size of an image to be processed. This frequency correction table (609) keeps correction coefficients respectively for the frequencies of the image. The correction coefficient represents an amplification factor for a corresponding frequency. When the correction coefficient is 1, no calculation is performed for the corresponding frequency.

Correction (603) is made for the frequency characteristic of the image obtained by shifting the image A based on the frequency correction table (609), so as to output an image A' (604) after shifted. By performing the frequency correction process (603), the frequency characteristics of the image A (601) and the image A' (604) are the same, within the frequency range having an effect on a difference between the length measurement values. Thus, there is no difference between the length measurement values. The frequency correction process (603) may be performed in accordance with a method of specifying an amplification factor of a particular frequency using an FFT (Fast Fourier Transform) or a method using an FIR (Finite Impulse Response) filter.

Figure 10:
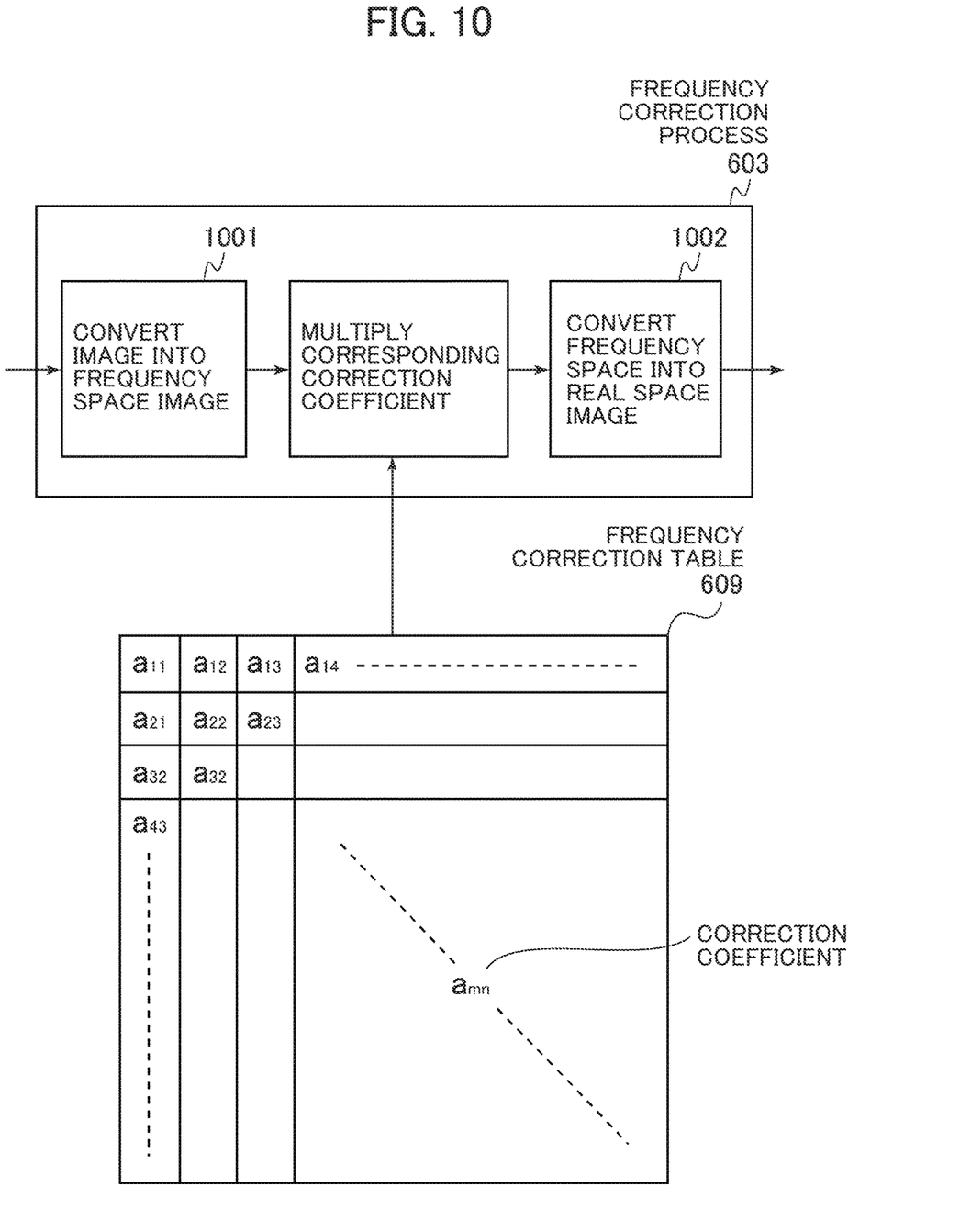
FIG. 10 is a diagram illustrating an example of a frequency characteristic correction process for an image in the first embodiment.

FIG. 10 illustrates an example of the frequency correction process (603), when the FFT is used.

The sub-pixel shifted image is converted to a frequency space image using the FFT (1001). At this stage, because pixels of the image form frequency information, a correction coefficient corresponding to this frequency is read out from the frequency correction table (609), and the correction coefficient is then multiplied with the amplitude of the frequency space image. The frequency space image after multiplied by the correction coefficient is converted (1002) to a real space image, by performing an inverse FFT process, thereby to correct the frequency characteristic.

As explained in the example of the CZP, in the frequency characteristic calculation process (607), the plane created by smoothly connecting the maximum values of the brightness of the image represents a change in the two-dimensional frequency characteristics. Thus, coefficients (generally, an inverse number) for making this change flat may be created. The created coefficients may be stored in the frequency correction table (609) as correction coefficients, in association with corresponding frequencies.

In the first embodiment, no difference will occur in the length measurement values, before and/or after shifting the image through the drift correction. Thus, it is possible to not only improve the accuracy of length measurement in the scanning electron microscope, but also enhance the length measurement reproducibility.

Second Embodiment

Figure 7:
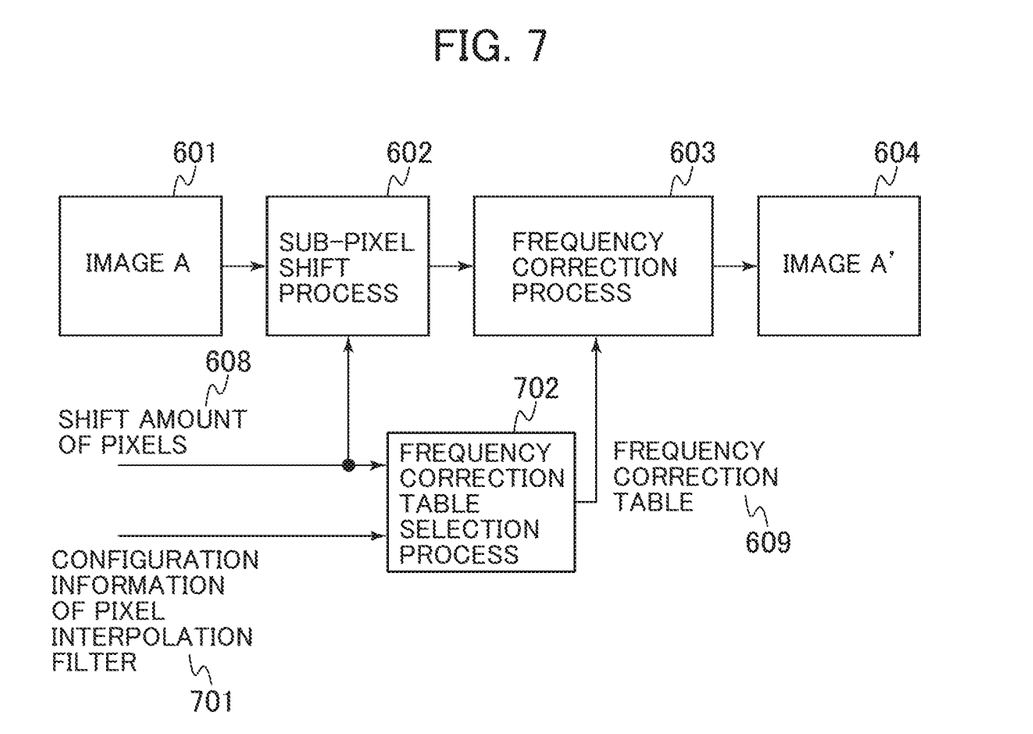
FIG. 7 is a diagram for explaining a drift correction process of a second embodiment.

By reference to FIG. 7, descriptions will now be made to a drift correction (image shifting) process of the second embodiment. In this case, the drift correction (image shifting) process is carried out by the correction calculation process 113 of FIG. 1.

When the frequency characteristic of the pixel interpolation filter is known, it is possible to suppress a change in the length measurement value, by correcting the frequency characteristic of the image created by pixel interpolation. In general, however, the frequency characteristic of the pixel interpolation filter is unintentionally changed, due to the pixel position for performing interpolation and a configuration method of the pixel interpolation filter. Thus, when it is assumed that the image is shifted to an arbitrary position, it is difficult to prepare a filter for correcting the frequency characteristic of the image in advance. The shift amount of the image which is obtained in Japanese Unexamined Patent Application Publication No. 2006-308471 and WO2010/070815 should be equal to the amount of sub-pixels toward the arbitrary position, while keeping in mind that the image is continuously moved.

As explained in the first embodiment, the frequency correction process (603) using the pixel interpolation filter is uniquely determined based on the pixel shift amount (608) and the configuration information (609) of the pixel interpolation filter. In the drift correction process, the pixel shift amount (608) is generally a real number. If quantization is performed, for example, for setting the drift amount at intervals of a decimal value of 0.1, the frequency correction process can be performed, as long as there are a limited number of frequency correction tables 609. For example, as illustrated in FIG. 7, it can be considered that the sub-pixel shift method may be configured.

The frequency table is created for decimal values for drift correction, as candidates for the method of the first embodiment, in advance. Then, a process (702) for selecting the frequency correction table 609 may be performed, based on the pixel shift amount (608) and the configuration information (701) of the pixel interpolation filter.

Figure 11:
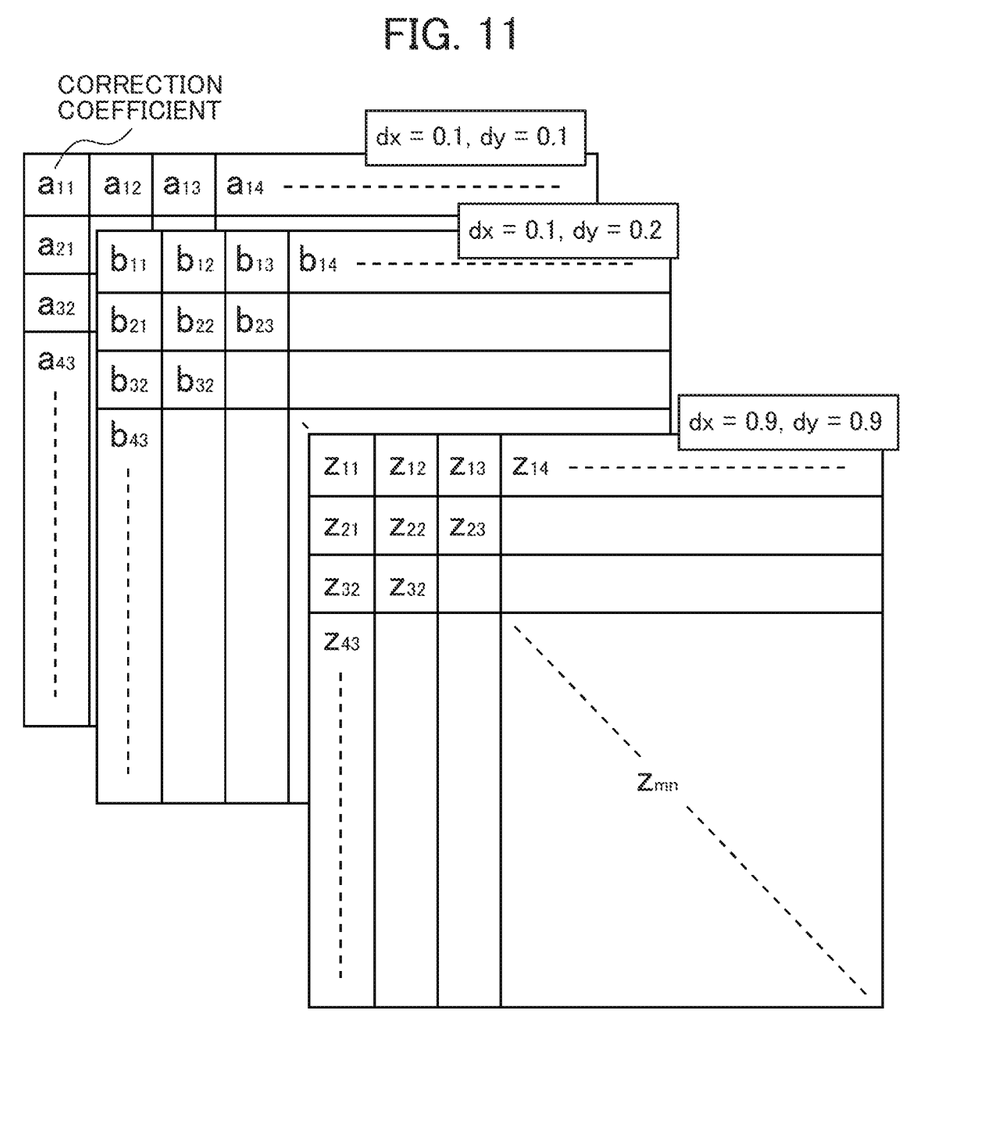
FIG. 11 is a diagram for explaining an example of a frequency correction table selection process in the second embodiment.

In the second embodiment, the frequency correction tables 609 are illustrated in FIG. 11, and are prepared, in advance, as a correction table group. Each table has correction coefficients respectively for fixed values, in association with a combination of a sub-pixel shift amount dx in the horizontal direction and a sub-pixel shift amount dy in the vertical direction. The frequency correction table selection process (702) is performed for selecting one correction table and outputting it as the frequency correction table (609) therefrom, in accordance with the sub-pixel shift amount.

When the sub-pixel shift process (602) differs from the sub-pixel shift process at the time of forming the correction table group, a corresponding correction table differs as well. Thus, the correction table group illustrated in FIG. 11 itself is switched to another correction table group, based on the configuration information (701) of the pixel interpolation filter.

According to the second embodiment, there will be no difference between the length measurement values before and/or after shifting the image through drift correction. Thus, it is possible to not only improve the accuracy in length measurement in the scanning electron microscope, but also enhance the length measurement reproducibility.

Third Embodiment

Figure 8:
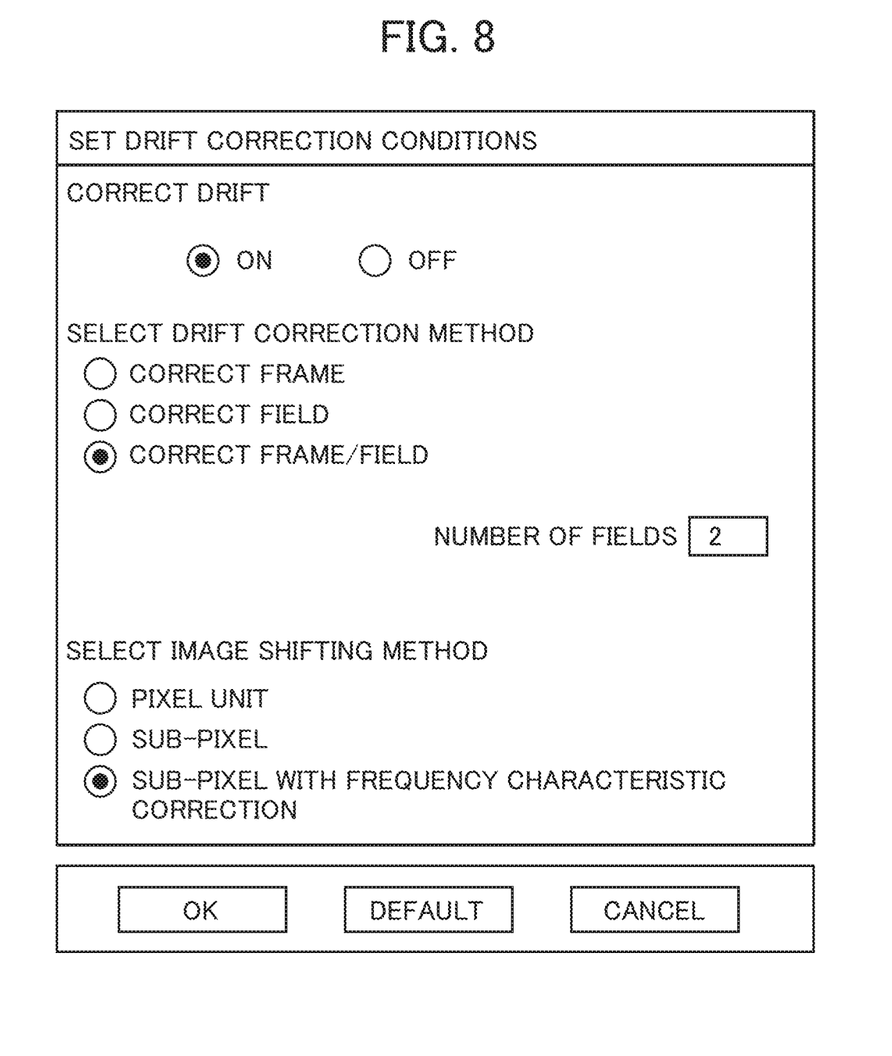
FIG. 8 is a diagram illustrating an example of a GUI for setting drift correction conditions.

By reference to FIG. 8. a third embodiment will now be described. FIG. 8 illustrates an example of a GUI (Graphical User Interface) for setting the environment for drift correction.

At the time of observing the image, a determination is made as to whether drift correction is to be executed, by a switching operation. The drift correction method is selected from any one or a combination of a frame search method and a field search method.

Then, the image shift method at the time of correcting the drift may be any of a shifting method in the unit of pixels, a shifting method of sub-pixels, and a shifting method of sub-pixels with correction of frequency characteristic.

The shifting in the unit of pixels is a method for shifting the image by rounding a movement search result between frames or fields to a value in the unit of integer pixels. With this method, there will be no difference between length measurement values by a process for shifting the image, though it may not be the actual shift amount.

The sub-pixel shift is an image sub-pixel shifting method for shifting a movement search result between frames or fields, itself as is, or after rounding the result to the determined decimal pixel accuracy using a pixel interpolation filter. In this method, there will be a difference between length measurement values, by the sub-pixel image shift.

The sub-pixel shift with frequency characteristic correction represents to apply the frequency characteristic correction filter configured in the first embodiment, to the above-described image after sub-pixel shifted. In this method, there is no difference between the length measurement values before and/or after performing the sub-pixel shift.

By providing the environment setting screen as described in the third embodiment, it is possible to set a specific method of the image shifting method at the time of drift correction. The monitor 114 of the display unit 103 of FIG. 1 can commonly be used as a GUI.

According to the above embodiments, in an image drift correction process, even if a plurality of frame images or field images are intentionally shifted by a sub-pixel amount, there will be no difference between the length measurement values before and/or after shifting the image. As a result, it is possible to improve the length measurement reproducibility.

Accordingly, the present invention is to provide a method for shifting the image by a sub-pixel amount without changing the length measurement value. Application of the methods described in the first and second embodiments to the image drift correction in the scanning-type electron microscope is only one example. Needless to say, they are applicable generally to a length measurement process using the sub-pixel shift process for the image.

What is claimed is:

1. An electron beam device comprising an electron microscope unit and a CPU,
wherein the electron microscope unit scans a specimen and irradiates an electron beam thereon, and detects a signal emitted from the specimen,
wherein the CPU is configured to
converts a signal detected by the electron microscope unit into an image,
perform a sub-pixel shift process for shifting the image by a pixel shift amount between pixels using a pixel interpolation filter and a frequency correction process for correcting a frequency characteristic of the image after shifted, thereby acquiring a correction image,
perform the sub-pixel shift process for a particular image,
perform a frequency characteristic calculation process for calculating a particular image frequency characteristic from the particular image after shifted, and outputting frequency correction information, and
perform the frequency correction process for correcting the frequency characteristic, using a frequency correction table storing the frequency characteristic information.

2. The electron beam device according to claim 1,
wherein the frequency correction table stores a correction coefficient in association with each frequency as the frequency correction information, so as to correct the frequency characteristic using the correction coefficient.

3. The electron beam device according to claim 2,
wherein the frequency correction process includes:
converting the image after shifted into a frequency space image;
reading the correction coefficient corresponding to the frequency from the frequency correction table, and multiplying the correction coefficient with an amplitude of the frequency space image; and
converting the frequency space image after multiplication of the coefficient into a real space image, thereby correcting the frequency characteristic.

4. The electron beam device according to claim 2,
wherein the frequency correction table stores an amplification factor for the frequency, as the correction coefficient.

5. The electron beam device according to claim 1,
wherein the CPU performs the sub-pixel shift process, using an image having a pattern which represents a recognizable change in a frequency of the particular image, as the particular image.

6. The electron beam device according to claim 1,
wherein the CPU performs the sub-pixel shift process, with using a part of an image whose minimum frequency corresponds to a direct current and whose maximum frequency is a sampling frequency in a range of space frequencies, as the particular image.

7. The electron beam device according to claim 1,
wherein the CPU:
performs a frequency correction table selection process for selecting one frequency correction table from a plurality of frequency correction tables storing frequency correction information in association with the pixel shift amount, based on the pixel shift amount and configuration information of the pixel interpolation filter; and
corrects the frequency characteristic through the frequency correction process, based on the frequency correction information stored in the frequency correction table which has been selected through the frequency correction table selection process.

8. The electron beam device according to claim 7,
wherein the frequency correction table is prepared in advance as a correction table group having correction coefficients in association with each combination of the pixel shift amount in a horizontal direction and the pixel shift amount in a vertical direction, and
wherein the frequency correction table selection process includes selecting of one correction table corresponding to the pixel shift amount from the correction table group.

9. The electron beam device according to claim 1,
wherein the CPU converts a signal detected by the electron microscope unit into a frame image and a field image forming the frame image, and
wherein the CPU performs the sub-pixel shift process, based on the pixel shift amount between the frame images or the field images.

10. The electron beam device according to claim 1, further comprising:
a display unit which displays information,
an image memory unit which stores the image, wherein the CPU performs the sub-pixel shift process and the frequency correction process for the image stored in the image memory unit, thereby acquiring the correction image, and wherein the display unit displays the correction image.

11. The electron beam device according to claim 10, wherein the display unit displays a correction condition setting screen enabling to execute the sub-pixel shift process and the frequency correction process.

12. An image processing method, using an electron beam device having an electron microscope unit and a CPU, the method comprising the steps of:

scanning a specimen by irradiating an electron beam thereon, and detecting a signal emitted from the specimen, in the electron microscope unit;

converting the signal detected by the electron microscope unit into an image, in the CPU;

performing a sub-pixel shift process for shifting the image by a pixel shift amount between pixels using the electron microscope unit and a frequency correction process for correcting a frequency characteristic of the image after shifted, thereby acquiring a correction image, in the CPU;

performing the sub-pixel shift process for a particular image;

performing a frequency characteristic calculating process for calculating a particular image frequency characteristic from the particular image after shifted, and outputting frequency correction information; and performing the frequency correction process to correct the frequency characteristic, using a frequency correction table storing the frequency correction information.

13. The image processing method according to claim 12, comprising the steps of:

performing a frequency correction table selection process for selecting one frequency correction table from a plurality of frequency correction tables storing frequency correction information in association with the pixel shift amount, based on the pixel shift amount and configuration information of the pixel interpolation filter; and performing the frequency correction process to correct the frequency characteristic, based on the frequency correction information stored in the frequency correction table which has been selected in the frequency correction table selection process.

* * * * *